US008105758B2

(12) United States Patent
Barwicz et al.

(10) Patent No.: US 8,105,758 B2
(45) Date of Patent: Jan. 31, 2012

(54) MICROPHOTONIC MASKLESS LITHOGRAPHY

(75) Inventors: Tymon Barwicz, Mount Kisco, NY (US); Milos Popovic, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 673 days.

(21) Appl. No.: 11/776,419

(22) Filed: Jul. 11, 2007

(65) Prior Publication Data

US 2008/0014534 A1 Jan. 17, 2008

Related U.S. Application Data

(60) Provisional application No. 60/830,126, filed on Jul. 11, 2006.

(51) Int. Cl.
G02B 6/26 (2006.01)
G02B 6/34 (2006.01)

(52) U.S. Cl. ............ 430/311; 430/327; 385/37; 385/15; 385/31; 359/566; 355/67

(58) Field of Classification Search ........................ None
See application file for complete search history.

(56) References Cited

U.S. PATENT DOCUMENTS

| | | | |
|---|---|---|---|
| 3,558,213 A | 1/1971 | Marcatili |
| 4,142,775 A | 3/1979 | Ramaswamy et al. |
| 4,679,893 A | 7/1987 | Ramer |
| 4,852,117 A | 7/1989 | Po |
| 5,371,817 A | 12/1994 | Revelli, Jr. et al. |
| 5,592,500 A | 1/1997 | Shirasaki |
| 5,625,403 A | 4/1997 | Hazman |
| 5,900,637 A | 5/1999 | Smith |
| 6,025,943 A | 2/2000 | Meekers et al. |
| 6,052,495 A | 4/2000 | Little et al. |
| 6,289,151 B1 | 9/2001 | Kazarinov et al. |
| 6,442,311 B1 * | 8/2002 | Barbarossa et al. ............ 385/37 |
| 6,480,644 B1 | 11/2002 | MacDonald |
| 6,529,277 B1 | 3/2003 | Weitekamp |
| 6,563,631 B2 | 5/2003 | Delprat et al. |
| 6,636,669 B1 | 10/2003 | Chin et al. |
| 6,668,111 B2 | 12/2003 | Tapalian et al. |
| 6,711,200 B1 | 3/2004 | Scherer et al. |
| 6,839,482 B2 | 1/2005 | Margalit |
| 6,847,750 B1 | 1/2005 | Baumann et al. |
| 6,947,632 B2 | 9/2005 | Fischer |
| 7,062,126 B2 | 6/2006 | Kersey et al. |
| 7,102,469 B2 | 9/2006 | Kim et al. |
| 7,110,632 B2 | 9/2006 | Abeles |
| 7,123,800 B2 | 10/2006 | Kaplan |
| 7,145,660 B2 | 12/2006 | Margalit et al. |
| 7,149,378 B2 | 12/2006 | Baumann et al. |
| 7,164,838 B2 | 1/2007 | Blauvelt et al. |
| 7,215,848 B2 | 5/2007 | Tan et al. |
| 7,292,751 B2 | 11/2007 | Popovic |
| 7,339,724 B2 | 3/2008 | Hochberg et al. |
| 7,450,811 B2 | 11/2008 | Hashimoto |
| 7,539,375 B2 | 5/2009 | Popovic |
| 7,583,874 B2 | 9/2009 | Rakich et al. |
| 7,903,909 B2 | 3/2011 | Popovic |
| 7,973,265 B2 | 7/2011 | Chu et al. |
| 2001/0040681 A1 | 11/2001 | Paiam et al. |
| 2001/0046344 A1 | 11/2001 | Hayashi et al. |
| 2002/0076188 A1 | 6/2002 | Kimerling et al. |
| 2002/0122648 A1 | 9/2002 | Mule' et al. |
| 2002/0136481 A1 | 9/2002 | Mule' et al. |
| 2002/0172466 A1 | 11/2002 | Baumann et al. |
| 2003/0015770 A1 | 1/2003 | Talin et al. |
| 2003/0128922 A1 | 7/2003 | Kolodziejski et al. |
| 2003/0138178 A1 | 7/2003 | Kimerling et al. |
| 2003/0156780 A1 | 8/2003 | Margalit et al. |
| 2003/0174974 A1 | 9/2003 | Yasuda et al. |
| 2003/0210860 A1 | 11/2003 | Margalit |
| 2003/0219052 A1 | 11/2003 | Goodhue et al. |
| 2004/0008942 A1 | 1/2004 | Scheuer et al. |
| 2004/0008968 A1 | 1/2004 | Lee et al. |
| 2004/0013355 A1 | 1/2004 | Margalit |
| 2004/0056243 A1 | 3/2004 | Atanackovic et al. |
| 2004/0114899 A1 | 6/2004 | Mattsson |
| 2004/0161188 A1 | 8/2004 | Su et al. |
| 2005/0036737 A1 | 2/2005 | Stuart |
| 2005/0068602 A1 | 3/2005 | Tormen et al. |
| 2005/0077526 A1 | 4/2005 | Shin et al. |
| 2005/0147348 A1 | 7/2005 | Grunnet-Jepsen et al. |
| 2005/0163418 A1 | 7/2005 | Wong et al. |
| 2005/0259937 A1 | 11/2005 | Whaley et al. |
| 2005/0275921 A1 | 12/2005 | Haus et al. |
| 2006/0029325 A1 | 2/2006 | Fardi et al. |
| 2006/0034569 A1 | 2/2006 | Shih et al. |
| 2006/0083456 A1 | 4/2006 | Burns et al. |

(Continued)

FOREIGN PATENT DOCUMENTS

EP 0646832 4/1995

(Continued)

OTHER PUBLICATIONS

Altug et al., "Ultrafast Photonic Crystal Nanocavity Laser," Nature Physics 2 (2006) pp. 484-488. Badolato et al., "Deterministic Coupling of Single Quantum Dots to Single Nanocavity Modes," Science 308 (2005) pp. 1158-1161.
Baehr-Jones et al., "High-Q Ring Resonators in Thin Silicon-on-Insulator," 85 Appl. Phys. Lett. 16 (Oct. 2004) pp. 3346-3347.
Barwicz, "3D analysis of scattering losses due to sidewall roughness in microphotonic waveguides: high index-contrast," 2005 Conf. on Lasers and Electro-Optics (CLEO), vol. 2, pp. 1333-1335.
Becker et al., "Optical Properties of Semiconductors. III. Infra-red Transmission of Silicon," 76 Physical Rev. A, pp. 1531-1532 (1949).
Bozhevolnyi et al., "Channel Plasmon Subwavelength Waveguide Components Including Interferometers and Ring Resonators," Nature 440 (2006) pp. 508-511.
Bustillo et al., "Surface Micromachining for Microelectromechanical Systems," Proc. of the IEEE 86 (1998) pp. 1552-1574.
Chan et al., "Single-mode and Polarization-independent Silicon-on-insulator waveguides with Small Cross Section," 23 J. Lightwave Tech. 6 (Jun. 2005) pp. 2103-2111.
Chuang, S.L., *Physics of Optoelectronic Devices*, (Wiley, NY, 1995).
Daldosso et al., "Comparison Among Various $Si_3N_4$ Waveguide Geometries Grown within a CMOS Fabrication Pilot Line," 22 J. Lightwave Tech. 7 (Jul. 2004) pp. 1734-1740.

(Continued)

*Primary Examiner* — Daborah Chacko Davis

(74) *Attorney, Agent, or Firm* — Goodwin Procter LLP

(57) ABSTRACT

A maskless lithography system and method to expose a pattern on a wafer by propagating a photon beam through a waveguide on a substrate in a plane parallel to a top surface of the wafer.

23 Claims, 8 Drawing Sheets

U.S. PATENT DOCUMENTS

| | | | |
|---|---|---|---|
| 2006/0134535 A1 | 6/2006 | Porque |
| 2006/0198566 A1 | 9/2006 | Watts |
| 2006/0239614 A1 | 10/2006 | Montgomery et al. |
| 2006/0274995 A1 | 12/2006 | Lee et al. |
| 2006/0291791 A1 | 12/2006 | Hochberg et al. |
| 2007/0035800 A1 | 2/2007 | Hochberg et al. |
| 2007/0133934 A1 | 6/2007 | Blauvelt et al. |
| 2007/0211992 A1 | 9/2007 | chu et al. |
| 2007/0230867 A1 | 10/2007 | Chen et al. |
| 2007/0253663 A1 | 11/2007 | Keyser et al. |
| 2008/0002992 A1 | 1/2008 | Hochberg et al. |
| 2008/0013876 A1 | 1/2008 | Gill et al. |
| 2008/0044184 A1 | 2/2008 | Popovic |
| 2008/0166095 A1 | 7/2008 | Popovic et al. |
| 2008/0199123 A1 | 8/2008 | Pan et al. |
| 2008/0266639 A1 | 10/2008 | Melloni et al. |
| 2009/0022445 A1 | 1/2009 | Hochberg et al. |
| 2009/0032805 A1 | 2/2009 | Ty Tan et al. |
| 2009/0142019 A1 | 6/2009 | Popovic |
| 2009/0220228 A1 | 9/2009 | Popovic |
| 2009/0239323 A1 | 9/2009 | Tan et al. |
| 2009/0256136 A1 | 10/2009 | Tan et al. |
| 2009/0290835 A1 | 11/2009 | Popovic |
| 2010/0002994 A1 | 1/2010 | Baehr-Jones et al. |
| 2010/0158429 A1 | 6/2010 | Popovic |
| 2010/0209038 A1 | 8/2010 | Popovic et al. |
| 2010/0303122 A1 | 12/2010 | Popovic |
| 2011/0026879 A1 | 2/2011 | Popovic et al. |
| 2011/0158584 A1 | 6/2011 | Popovic |

FOREIGN PATENT DOCUMENTS

| | | |
|---|---|---|
| EP | 0909963 | 4/1999 |
| EP | 1024378 A2 | 8/2000 |
| EP | 1241497 | 9/2002 |
| EP | 1717616 A1 | 11/2006 |
| EP | 1 785 771 | 5/2007 |
| JP | 2001-194160 A | 7/2001 |
| WO | WO-8501123 | 3/1985 |
| WO | WO-0050938 A1 | 8/2000 |
| WO | WO-0123955 A2 | 4/2001 |
| WO | WO-0155814 A2 | 8/2001 |
| WO | WO-0188580 | 11/2001 |
| WO | WO-01/96913 A1 | 12/2001 |
| WO | WO-0217004 | 2/2002 |
| WO | WO-02063389 | 8/2002 |
| WO | WO-02/101421 A2 | 12/2002 |
| WO | WO-03/043247 A2 | 5/2003 |
| WO | WO-03036841 | 5/2003 |
| WO | WO-2005/010618 | 2/2005 |
| WO | WO-2005/104147 | 11/2005 |
| WO | WO-2006/025760 | 3/2006 |
| WO | WO-2006/076585 A2 | 7/2006 |
| WO | WO-2007/086888 A2 | 8/2007 |

OTHER PUBLICATIONS

Daldosso et al., "Fabrication and Optical Characterization of thin two-dimensional Si$_3$N$_4$ Waveguides," Mat. Sci. in Semicond. Proc. 7, (2004) pp. 453-458.

Dumon et al., "Low-loss photonic wires and compact ring resonators in silicon-on-insulator," 5450 Proc. SPIE 1, pp. 360-368 (2004).

Eichenfield et al., "Actuation of Micro-optomechanical Systems via Cavity-enhanced Optical Dipole Forces," http://arXiv:physics/0702231.

Examination Report in European Patent Application No. 04786154.7, mailed Jul. 16, 2008.

Gritsenko et al., "Short-range order in non-stoichiometric amorphous silicon oxynitride and silicon-rich nitride," 297 J. Non-Crystalline Solids 1, pp. 96-101 (Jan. 2002).

Guo et al., "Characterization of Si$_3$N$_4$/SiO$_2$ Planar Lightwave Circuits and Ring Resonators," Proc. of SPIE, vol. 5350 (2004) pp. 13-22.

Guo et al., "High-Q Microring Resonator for Biochemical Sensors," 5728 Proc. SPIE, pp. 83-92 (2005).

Haus, H.A. *Waves and Fields in Optoelectronics*, (Prentice-Hall, Englewood Cliffs, NJ, 1984).

In et al., "Origami Fabrication of Nanostructured, Three-dimensional Devices: Electrochemical Capacitors with Carbon Electrodes," Appl. Phys. Lett. 88 (2006) 83104.

International Preliminary Report on Patentability and Written Opinion for PCT/US06/028848, mailed Feb. 7, 2008.

International Search Report & Written Opinion for PCT/US2005/043762, mailed Jun. 19, 2008, 8 pages.

International Search Report & Written Opinion for PCT/US2007/026513, mailed Jun. 19, 2008.

International Search Report for PCT/US06/28848, mailed Feb. 16, 2007.

Jackson, J.D., *Classical Electrodynamics* (Wiley, NY, 1999).

Johnson et al., "Perturbation Theory for Maxwell's Equations with Shifting Boundaries," Phys. Rev. E, 65, 066611 (2002).

Kippenberg et al., "Analysis of Radiation-pressure Induced Mechanical Oscillation of an Optical Microcavity," Phys. Rev. Lett. 95 (2005) 033901.

Kogelnik et al., "Switched Directional Couplers with Alternating $\Delta\beta$," 12 IEEE J. Quantum Elec. 7, pp. 396-401 (1976).

Korotky, "Three-Space Representation of Phase-Mismatch Switching in Coupled Two-State Optical System," 22 IEEE J. Quantum Elec. 6, pp. 952-958 (1986).

Little et al., "Very High-order Microring Resonator Filters for WDM Applications," 16 IEEE Photonics Tech. Lett. 10 (Oct. 2004) pp. 2263-2265.

Maboudian et al., "Critical Review: Adhesion in Surface Micromechanical Structures," J. Vac. Sci. Tech. B, 15 (1997).

Madsen et al., "A Multi-Port Add/Drop Router using UV-induced Gratings in Planar Waveguides," Lucent Technologies, pp. 104-106.

Madsen et al., Optical Filter Design and Analysis: A Signal Processing Approach, (Wiley, NY, 1999).

Melchiorri et al., "Propogation Losses of Silicon Nitride Waveguides in the Near Infrared Range," Appl. Phys. Lett. 86, 121111 (2005).

Mizrahi et al., "Mirror Manipulation by Attractive and Repulsive Forces of Guided Waves," Opt. Express 13 (2005) pp. 9804-9811.

Mizrahi et al., "Two Slab Optical Spring," Optics Lett. 32 (2007) pp. 692-694.

Nichol et al., "Thin Membrane Self-alignment using Nanomagnets for Three-dimensional Nanomanufacturing," J. Vac. Sci. Tech B (Microelectronics & Nanometer Structures) 24 (2006) pp. 3128-3132.

Nichols et al., "A Preliminary Communication on the Pressure of Heat and Light Radiation," Phys. Rev. 13 (1901) pp. 307-320.

Nielson et al., "Integrated Wavelength-selective Optical MEMS Switching using Ring Resonator Filters," IEEE Photonics Tech. Lett. 17 (2005) pp. 1190-1192.

Nielson, G.N., "Micro-opto-mechanical Switching and Tuning for Integrated Optical Systems," Ph.D. Thesis, Massachusetts Institute of Technology (2004).

Notomi et al., "Optomechanical Wavelength and Energy Conversion in High-Q Double-layer Cavities of Photonic Crystal Slabs," Phys. Rev. Lett. 97 (2006) 023903.

Oda et al., "A Wide-FSR Waveguide Double-Ring Resonator for Optical FDM Transmission Systems," 9 J. Lightwave Tech. 6, pp. 728-736 (1991).

Okamoto, K., *Fundamentals of Optical Waveguides*, (Elsevier Academic Press, MA, 2006).

Philipp et al., "Amorphous Silicon Rich Silicon Nitride Optical Waveguides for High Density Integrated Optics," 40 IEEE Electronics Letters 7, pp. 419-420. (Apr. 2004).

Popovic et al., "General Approach to Hitless Switching and FSR Extension Resonators in Integrated Photonic Circuits," (2006) Paper OW166.

Popovic et al., "High-index-contrast, Wide-FSR Microring-Resonator Filter Design and Realization with Frequency-shift Compensation," *in* Optical Fiber Communication Conf., Tech. Dig. (2005) Paper OFK1, vol. 5, pp. 213-215.

Popovic et al., "Multistage High-Order Microring-Resonator add-drop Filters," 31 Optics Lett. 17 (Sep. 2006) pp. 2571-2573.

Popovic, "Air Trenches for Dense Silica Integrated Optics," MS Thesis, Massachusetts Institute of Technology, Dept. of Electrical Engineering & Computer Science, Feb. 2002, p. 53.

Popovic, M., "Complex-frequency Leaky Mode Computations using PML Boundary Layers for Dielectric Resonant Structures," Proc. of Integ. Photonics Res. (Jun. 2003).

Povinelli et al., "Evanescent-wave Bonding Between Optical Waveguides," Optical Lett. 30 (2005) pp. 3042-3044.

Povinelli et al., "High-Q Enhancement of Attractive and Repulsive Optical Forces between Coupled Whispering-gallery-mode Resonators," Opt. Express 13 (2005) pp. 8286-8295.

Qi et al., "A Three-dimensional Optical Photonic Crystal with Designed Point Defects," Nature 429 (2004) pp. 538-542.

Rakich et al., "Achieving Centimeter-scale supercollimation in a Large-area Two-dimensional Photonic Crystal," Nature Materials 5 (2006) pp. 93-96.

Rakich et al., "Cavity-Trapping via Optical-forces in Integrated Photonics," Massachusetts Institute of Technology.

Rakich et al., "Ultrawide Tuning of Photonic Microcavities via Evanescent Field Perturbation," Optics Lett. 31 (2006) pp. 1241-1243.

Sarid, D., Scanning Force Microscopy with Applications to Electric, Magnetic, and Atomi Forces, (Oxford University Press, NY, 1994).

Saynatjoki et al., "High-index-contrast Optical Waveguides on Silicon," 2 pages.

Scotti et al., "A Hitless Reconfigureable Add-Drop Multiplexer of WDM Networks Utilizing Planar Waveguides, Thermo-Optic Switches and UV-Induced Gratings," OFC Tech. Dig., pp. 142-143 (1998).

Song et al., "Ultra-high-Q Photonic Double-heterostructure Nanocavity," Nature Materials 4 (2005) pp. 207-210.

Spector et al., "Hybrid multi-mode/single-mode Waveguides for Low Loss," Massachusetts Institute of Technology, 3 pages.

Srinivasan et al., "Alkyltrichlorosilane-based Self-assembled Monolayer Films for Stiction Reduction in Silicon Micromachines," J. of Microelectromechanical Sys. 7 (1998) pp. 252-260.

Tormen, "Passive Optical Integrated Components for Telecommunication," Universite De Nice-Sophia Antipolis (2003) 196 pages.

Van Spengen et al., "A Physical Model to Predict Stiction in MEMS," J. of Micromechanics & Microengineering 12 (2002) pp. 702-713.

Yanagase et al., "Box-Like Filter Response and Expansion of FSR by a Vertically Triple Coupled Microring Resonator Filter," 20 J. Lightwave Tech. 8, pp. 1525-1529 (2002).

International Search Report for PCT/US2007/015740 dated Feb. 18, 2008 (4 pages).

Written Opinion of the ISA for PCT/US2007/015740 dated Feb. 18, 2008 (6 pages).

Bogaerts et al., "Low-loss, low-cross-talk crossings for silicon-on-insulator nanophotonic waveguides," 32 Optics Letters 19, pp. 2801-2803 (1995).

Chen et al., "Low-loss multimode-interference-based crossings for Silicon Wire Waveguides," 18 IEEE Photonics Letters 21, pp. 2260-2262 (2006).

International Preliminary Report on Patentability for PCT/US2007/026513 dated Jul. 9, 2009.

International Search Report & Written Opinion for PCT/US2008/082054, dated Mar. 18, 2009.

International Search Report and Written Opinion for PCT/US2007/026513, dated Dec. 28, 2007 (15 pages).

International Search Report and Written Opinion for PCT/US2008/080749, dated May 25, 2009 (19 pages).

Liu et al., "Low-loss waveguide crossing using a multimode interference structure," 241 Optics Communications 1-3, pp. 99-104 (2004).

Partial International Search Report for PCT/US2008/080749, dated Mar. 24, 2009.

Popovic, "Theory and Design of High-Index-Contrast Microphotonic Circuits," Ph.D. Thesis, Massachusetts Institute of Technology, Dept. of Electrical Engineering & Computer Science, Feb. 2008.

Povinelli et al., "Enhancement mechanisms for optical forces in integrated optics," 6326 Proc. of SPIE Optical Trapping & Optical Manip. III 15 (2006).

Rakich et al., "Trapping, corraling and spectral bonding of optical resonances through optically induced potentials," 1 Nature Photonics 11, pp. 658-665 (2007).

Tang et al., "Highly efficient optical phase modulator in SOI waveguides," 31 Electronics Letters 6, pp. 451-452 (1995).

Xu et al., "Micrometre-scale silicon electro-optic modulator," Nature, vol. 435, pp. 325-327 (2005).

Barbarossa et al., "Novel Double-Ring Optical-Guided-Wave Vernier Resonator," 144 IEE Proc.-Optoelectron. 4, pp. 203-208 (Aug. 1997).

Barbarossa et al., "Theoretical Analysis of Triple-Coupler Ring-Based Optical Guided-Wave Resonator," 13 J. Lightwave Tech. 2, pp. 148-157 (Feb. 1995).

Barbarossa et al., "Triple-Coupler Ring-Based Optical Guided-Wave Resonator," 30 IEEE Electronics Lett. 2, pp. 131-133 (Jan. 20, 1994).

Barwicz et al., "Polarization-transparent microphotonic devices in the Strong Confinement Limit," Nature Photonics 1, pp. 57-60 (Jan. 2007).

Batten et al., "Building Manycore Processor-to-DRAM Networks with Monolithic CMOS Si Photonics," IEEE Micro, p. 8-21 (Jul. 2009).

Bethe, "Theory of Diffraction by Small Holes," 66 Phys. Rev. 7-8, pp. 163-182 (Oct. 1944).

Campbell et al., "GaAs Electro-Optic Directional-coupler switch," 27 Applied Physics Lett. 4, pp. 202-205 (Aug. 1975).

Chremmos et al., "Properties of Regular Polygons of Coupled Microring Resonators," 46 Applied Optics Optical Society of America 31, pp. 7730-7738 (Nov. 1, 2007).

Darmawan et al., "Nested Ring Mach-Zender Interferometer," 15 Optics Express Opt. Soc. America 2, pp. 437-448 (Jan. 2001).

Doerr et al., "Wavelength Add-Drop Node Using Silica Waveguide Integration," 22 J. Lightwave Tech. 12, pp. 2755-2762 (Dec. 2004).

Domash et al., "Tunable and Switchable Multiple-Cavity Thin Film Filters," 22 J. Lightwave Tech. 1, pp. 126-135 (Jan. 2004).

Espinola et al., "Fast and Low-Power Thermooptic Switch on Thin Silicon-on-Insulator," 15 IEEE Photon. Tech. Lett. 10, pp. 1366-1368 (2003).

Fan et al., "Theoretical Analysis of Channel Drop Tunneling Processes," 59 Phys. Rev. B 2, pp. 15882-15892 (Jun. 15, 1999).

Findakly et al., "On the Crosstalk of Reversed-$\gamma\beta$ Durectional Coupler Switches," 6 J. of Lightwave Tech. 1, pp. 36-40 (Jan. 1988).

Geuzebroek et al., "Thermally Tuneable, Wide FSR Switch based on Micro-ring Resonators," Proc. Symp. IEEE/LEOS Benelux Chapter, pp. 155-158 (2002).

Gheorma et al., IEEE Photon. Tech. Lett. 14, 795 (2002).

Goebuchi et al., "Fast and Stable Wavelength-Selective Switch Using Double-Series Coupled Dielectric Microring Resonator," 18 IEEE Photonics Tech. Lett. 3, pp. 538-540 (Feb. 1, 2006).

Green et al., Optics Express 15, 17264 (2007).

Green et al., Optics Express 15, 17106 (2007).

Gunn, "CMOS Photonics for High-Speed Interconnects," IEEE Micro 26 (2), pp. 58-66 (Mar./Apr. 2006).

Gupta et al., Conf. on Lasers and Electro-Optics (CLEO), p. paper CTuNN5 (2008).

Haus et al., "Elimination of Cross Talk in Optical Directional Couplers," 46 Applied Physics Lett. 1, pp. 1-3 (Jan. 1, 1985).

Haus et al., "Broadband Hitless Bypass Switch for Integrated Photonic Circuits," 18 IEEE Photonics Tech. Lett. 10, pp. 1137-1139 (May 15, 2006).

Holzwarth et al., "High Speed analog-to-digital conversion with silicon photonics," *in* Proc. SPIE 7220, 72200B (2009).

International Preliminary Report on Patentability in International Patent Application No. PCT/U52008/003957, dated Sep. 29, 2009 (11 pages).

International Search Report & Written Opinion for PCT/US2009/041668, mailed Sep. 11, 2009 (14 pages).

International Search Report & Written Opinion for International Patent Application No. PCT/US2007/018207, mailed Jul. 29, 2008 (13 pages).

International Search Report & Written Opinion for PCT/US2008/00330, mailed Oct. 14, 2008.

International Search Report & Written Opinion for PCT/US2009/066537, mailed Apr. 16, 2010 (17 pages).

Kelly et al., "Monolithic Suspended Optical Waveguides for InP MEMS," 16 IEEE Photonics Tech. Letters 5, pp. 1298-1300 (2004).

Khan et al., "Mode-Coupling Analysis of Multipole Symmetric Resonant Add/Drop Filters," 35 IEEE J. of Quantum Elec. 10, pp. 1451-1460 (Oct. 1999).

Khurgin et al., "Expanding the Bandwidth of Slow-Light Photonic Devices Based on Coupled Resonators," 30 Optics Lett. 5, pp. 513-515 (Mar. 1, 2005).

Lee et al., "MEMS-Actuated Microdisk Resonators with Variable Power Coupling Ratios," 17 IEEE Photonics Tech. Lett. 5, pp. 1034-1036 (May 2005).

Lee et al., "Tunable Coupling Regimes of Silicon Microdisk Resonators using MEMS Actuators," 14 Optics Express 11, pp. 4703-4712 (May 29, 2006).

Li et al., Optics Express 16, 13342 (2008).

Little et al., "Filter Synthesis for Periodically Coupled Microring Resonators," 25 Optics Lett. 5, pp. 344-346 (Mar. 1, 2000).

Little et al., "Microring Resonator Channel Dropping Filters," J. Lightwave Tech. 15, pp. 998-1005 (1997).

Little et al., "Wavelength Switching and Routing using Absorption and Resonance," 10 IEEE Photonics Tech. Lett. 6, pp. 816-818 (Jun. 1998).

Madsen, "Efficient Architectures for Exactly Realizing Optical Filters with Optimum Bandpass Designs," 10 IEEE Photonics Tech. Lett. 8, pp. 1136-1138 (Aug. 1998).

Madsen et al., "Hitless Reconfigurable Add/Drop Multiplexers using Bragg Gratings in Planar Waveguides," OSA TOPS, v. 29, WDM Components, pp. 54-60.

Manolatou et al., "High-Density Integrated Optics," 17 J. Lightwave Tech. 9, pp. 1682-1692 (Sep. 1999).

Manolatou et al., "Coupling of Modes Analysis of Resonant Channel Add-Drop Filters," 35 IEEE J. of Quantum Elec. 9, pp. 1322-1331 (Sep. 1999).

McDonald, "Electric and Magnetic Coupling through Small Apertures in Shield Walls of any Thickness," MTT-20 IEEE Trans. on Microwave Theory & Techniques 10, pp. 689-695 (Oct. 1972).

Melloni et al., "Synthesis of Direct-Coupled-Resonators Bandpass Filters for WDM Systems Lightwave Technology," 20 J. Lightwave Tech. 2, pp. 296-303 (2002).

Melloni et al., Integr. Photon. Research and Applications/Nanophotonics (IPNRA), p. paper IMC1 (2006).

Papuchon et al., "Electrically switched Optical Directional Coupler: Cobra," 27 Applied Physics Lett. 5, pp. 289-291 (Sep. 1, 1975).

Partial International Search Report for International Application No. PCT/US2007/018207, mailed Jun. 2, 2008 (5 pages).

Partial International Search Report for International Application No. PCT/US2008/00330, mailed Jul. 30, 2008 (5 pages).

Partial International Search Report for International Application No. PCT/US2008/003957, mailed Jun. 16, 2008 (8 pages).

Poon et al., "Wavelength-selective reflector based on a circular array of coupled microring resonators," 16 IEEE Photonics Technology Letters 5, pp. 1331-1333 (May 2004).

Popovic, "Optimally efficient resonance-tuned optical modulators," in CLEO 2009, paper CTuV6 (2 pages) (May 2009).

Popovic et al., Optics Express 14, 1208 (2006).

Popovic, Resonant optical modulators beyond conventional energy-efficiency and modulation frequency limitations.

Rabiei et al., "Polymer Micro-Ring Filters and Modulators," J. Lightwave Tech. 20, 1968 (2002).

Rezzonico et al., Optics Express 16, 613 (2008).

Rhodes, "A Low-Pass Filter Prototype Network for Microwave Linear Phase Filters," MTT-18 IEEE Trans. Microwave Theory Tech. 6, pp. 290-301 (Jun. 1970).

Sacher et al., Optics Express 16, 15741 (2008).

Sugimoto et al., "Waveguide polarization-independent Optical Circulator," 11 IEEE Photon. Tech. Lett. 3, pp. 355-357 (Mar. 1999).

Suh et al., "Temporal Coupled-Mode Theory and the Presence of Non-Orthogonal Modes in Lossless Multimode Cavities," 40 IEEE J. of Quantum Elec. 10, pp. 1511-1518 (Oct. 2004).

Takahashi et al., "Tunable Chromatic Dispersion Compensator Utilizing Silica Waveguide Ring Resonator having Mach-Zehnder Interferometric Variable Coupler Eliminating Crossing Point of Waveguides," 15th Annual Meeting of IEEE Lasers and Electro-Optics Society, v.2, pp. 665-666 (Nov. 10-14, 2002).

Watts et al., "Maximally Confined Silicon Microphotonic Modulators and Switches," IEEE Proc. of the LEOS Ann. Meet., p paper WF1, pp. 457-458 (2008).

Weber et al., "Crosstalk and Switching Characteristics in Directional Couplers," 24 IEEE J. of Quantum Elect. 3, pp. 537-548 (Mar. 1988).

Wei et al., "Compound Ring Resonator with Double Couplers," 186 Optics Communications 4-6, pp. 283-290 (Dec. 15, 2000).

Williamson, "Sensitivity-bandwidth product for electro-optic modulators," Optics Letters 26, 1362 (2001).

Xu et al., "Experimental Realization of an on-Chip All-Optical Analogue to Electromagnetically Induced Transparency," Phys. Rev. Lett. 96, pp. 1-4 (2006).

Yanik et al., "Stopping Light All Optically," 92 Phy. Rev. Lett. 8, pp. 1-4 (Feb. 27, 2004).

Yariv et al., "Coupled-Resonator Optical Waveguide: a Proposal and Analysis," 24 Optics Lett. 11, pp. 711-713 (Jun. 1, 1999).

DeVaux et al., "High-speed tandem of MQW modulators for coded pulse generation with 14-DB fiber-to-fiber gain," 8 IEEE Photonics Tech. Lett. 2, pp. 218-220 (Feb. 1996).

International Preliminary Report on Patentability for PCT/US2009/041668, mailed Nov. 11, 2010 (7 pages).

International Search Report & Written Opinion for PCT/US2010/036630, mailed Sep. 15, 2010, 12 pages.

Kyle et al., "High-Speed all-optical modulation using polycrystalline silicon microring resonators," 92 Appl. Phys. Lett. 15 (Apr. 15, 2008).

* cited by examiner

US 8,105,758 B2

MICROPHOTONIC MASKLESS LITHOGRAPHY

RELATED APPLICATIONS

This application claims the benefit of and priority to U.S. Provisional Application Ser. No. 60/830,126 filed Jul. 11, 2006, the entire disclosure of which is hereby incorporated by reference.

FIELD OF THE INVENTION

The technology disclosed herein relates generally to microfabrication and nanofabrication and, more specifically, to lithography.

BACKGROUND

In general, lithography is a necessary step in planar processing of microstructures and nanostructures. It is the step defining the in-plane shape of the structures. One may distinguish between lithographic systems employing a mask and systems not employing masks. The latter are referred to as maskless lithography systems. Lithographic systems employing a mask have the advantage of being able to replicate the mask pattern on substrates at high speed. This is the case in projection lithography, contact lithography, imprint lithography, EUV lithography, and x-ray lithography, which are typically used in high-volume production. The mask itself is typically fabricated using a maskless lithography system such as a scanning electron-beam lithography system, a zone-plate-array lithography (ZPAL) system, or a laser writer. Maskless lithography systems can generate virtually any pattern and do not replicate a pattern from a mask. However, this arbitrary pattern generation is typically much slower than mask replication. Hence maskless lithography systems ordinarily are not directly used in production. They are used primarily for prototyping and mask manufacturing.

SUMMARY OF THE INVENTION

Key parameters in lithography are resolution and throughput. In various embodiments, the invention achieves several orders of magnitude greater throughputs than previously available and similar resolution to the state of the art. A very large number of independently modulated photon beams can be focused on the surface of a wafer. The wafer's position relative to the array of modulated beams is scanned below the array of modulated beams to expose desired patterns on it.

In one embodiment of the invention, a photon beam is confined to a waveguide and travels in a plane parallel to the wafer. The photon beam is then modulated also in a plane parallel to the wafer. The modulated photon beam reaches an output vertical coupler that projects and focuses the beam onto the surface of the wafer. The photon source may be integrated with the waveguides and the modulators or may be external so the generated photon beam is coupled to the waveguides using an input vertical coupler.

In another embodiment of the invention, a modulated photon beam encoded using wavelength division multiplexing (WDM) is coupled to a waveguide using a vertical coupler. A WDM signal is formed of independently modulated wavelength channels. The photon beam travels in a plane parallel to the wafer to be exposed. Then, it reaches a wavelength demultiplexer that routes the various wavelengths, or subsets of wavelengths, composing the WDM beam into a plurality of photon beams. Each of the beams encounters a vertical coupler that projects and focuses the beam onto the surface of the wafer. The photon beam reaching the vertical coupler may be composed of one or a plurality of WDM wavelength channels. When a plurality of WDM wavelength channels are used in a photon beam reaching a vertical coupler, the vertical coupler can be designed so that each wavelength channel is focused on a different point on the wafer surface, thereby allowing for exposure of multiple pixels with one vertical coupler. Such a vertical coupler is referred to herein as a multi-wavelength vertical coupler (MVC).

Embodiments of the invention feature a completely integrated solution fully compatible with planar processing. Hence, embodiments of the invention are easily scalable. This allows for a high number of parallel photon beams. Moreover, the use of in-plane modulators allows for higher modulation speed than out-of-plane modulators. This results in high exposure speeds for a maskless lithography system. A conservative estimate of an exemplary exposure speed of the disclosed technology may be attained by assuming a modulation speed of 1 GHz (40 GHz in-plane modulators have already been demonstrated) and 1000 photon beams (easily achievable with today's technology). The resulting exposure speed is around one terapixel per second.

In an aspect, the invention features a maskless lithography system for exposing a pattern on a wafer. The system includes a photon source for generating a photon beam; and a waveguide disposed on a substrate, the waveguide, for propagating the photon beam in a plane parallel to a top surface of the wafer disposed thereunder.

One or more of the following features may be included. An in-plane modulator may modulate the photon beam propagating in the plane parallel to the top surface of the wafer. An output vertical coupler may redirect the photon beam from an in-plane direction to an out-of-plane direction towards the top surface of the wafer. A focusing element may focus the photon beam propagating in the out-of-plane direction onto the top surface of the wafer. The output vertical coupler and the focusing element may form a single integrated optical device.

The photon source may be an external photon source, and an input vertical coupler may couple the external photon source to the waveguide. The photon source may be disposed on the substrate and configured to emit a photon beam in a direction parallel to a top surface of the wafer. The photon beam may have a plurality of wavelength channels.

A wavelength demultiplexer may be disposed in a plane parallel to the top surface of the wafer to demultiplex the photon beam, with the system including a plurality of the waveguides to guide the demultiplexed photon beams from the wavelength demultiplexer. A multi-wavelength vertical coupler may redirect the photon beam from an in-plane direction to an out-of-plane direction. The multi-wavelength vertical coupler may redirect a plurality of wavelength channels constituting the photon beam from an in-plane direction to a plurality of out-of-plane directions that are substantially different for at least two wavelength channels. The multi-wavelength vertical coupler may focus at least two of the wavelength channels on substantially different positions on the top surface of the wafer.

A wavelength of the photon beam may be selected from a range of 150 nanometers to 1000 nanometers. The photon source may generate a plurality of the photon beams. A beam separator, such as a power splitter, a demultiplexer, a multi-wavelength vertical coupler, or a combination thereof, may be configured to split the photon beam into a plurality of output photon beams.

In another aspect, the invention features a method for exposing a pattern on a wafer. A thin photon-sensitive film is formed over a top surface of the wafer. At least a portion of the photon-sensitive film is exposed by propagating the photon beam in a waveguide on a substrate in a direction parallel to the top surface of the wafer and redirecting the photon beam from an in-plane to an out-of-plane direction towards the portion of the thin photon-sensitive film.

One or more of the following features may be included. The photon beam may be redirected by an output vertical coupler. The output vertical coupler may redirect the photon beam from an in-plane direction to an out-of-plane direction and may focus the photon beam on the wafer. The output vertical coupler comprises a multi-wavelength vertical coupler. The photon beam may be modulated in a plane parallel to the top surface of the wafer. The photon beam may be provided by an external photon source. The photon beam may be provided in a maskless lithography system including an input vertical coupler, and the photon beam may be coupled from the external photon source to the waveguide with the input vertical coupler.

The photon beam may include a plurality of wavelength channels. The maskless lithography system may include a wavelength demultiplexer disposed in a plane parallel to the top surface of the wafer and configured to demultiplex the photon beam, and a plurality of the waveguides may be configured to guide the demultiplexed photon beams from the wavelength demultiplexer to a plurality of output vertical couplers.

In yet another aspect, the invention includes a method for exposing a pattern on a wafer. A thin photon-sensitive film is formed over a top surface of the wafer. A photon beam is propagated in a waveguide on a substrate in a direction parallel to the top surface of the wafer and redirected to a vertical path towards the photon-sensitive film to expose at least a portion thereof, thereby substantially reproducing a predetermined pattern.

DETAILED DESCRIPTION

Definitions

Figure 1:
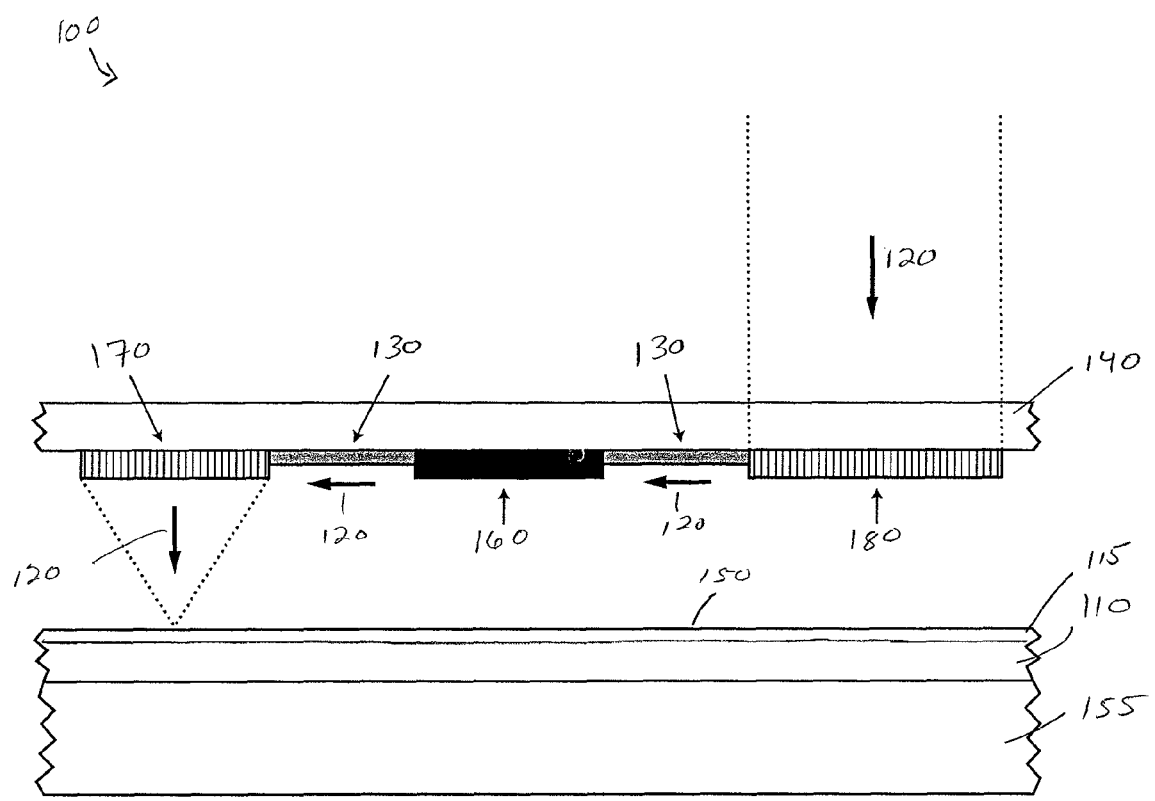
FIG. 1 is a schematic side view illustrating an embodiment of the invention employing an external photon source.

As used herein, the term waveguide means a structure that can guide a photon beam. This includes but is not limited to dielectric waveguides such as rib waveguides, ridge waveguides, strip waveguides, wire waveguides, and rectangular waveguides. Any waveguide design may be employed in embodiments of the present invention.

As used herein, the term vertical coupler means a structure that can couple a photon beam from free space to a waveguide while changing the direction of the photon beam significantly. Hence, the directions of propagation of the beam in free space and in the waveguide differ by a significant angle. A vertical coupler also works in the reverse direction. It couples a photon beam from a waveguide to free-space while changing the direction of the photon beam significantly. A free-space photon beam emerging from a vertical coupler can be focused or not focused by the vertical coupler, depending on the design of the vertical coupler. Vertical couplers include but are not limited to vertical couplers based on gratings (single or multiple ones). Almost any vertical coupler design may be employed in embodiments of the present invention.

As used herein, the term multi-wavelength vertical coupler means a vertical coupler, as described above, that can separate and focus at different positions on the surface of the wafer to be exposed a plurality of wavelength channels of a WDM photon beam. For instance, it may be a vertical coupler that is angle-dispersive, i.e., is designed to significantly change the direction of the output beam as a function of the wavelength of the beam. In such an angle-dispersive embodiment, when receiving as input a WDM photon beam including a plurality of wavelength channels, the wavelength channels will be radiated in substantially different output angular directions. MVCs include but are not limited to vertical couplers based on gratings.

As used herein, the term modulator means a structure that can rapidly change the intensity of a photon beam. An in-plane modulator is one that receives the photon beam to be modulated from a waveguide in a plane parallel to the plane of the modulator. This includes but is not limited to modulators that work by inducing a phase change in one arm of an in-plane interferometer. An out-of-plane modulator is one that modulates a photon beam traveling at a significant angle with respect to the plane of the modulator. This includes micro-electro-mechanical systems (MEMS) actuating mirrors and gratings. The technology disclosed herein may employ almost any in-plane modulator design.

As used herein, the term photon source means a device that creates a beam of photons with substantially similar energy. An external photon source, such as the one used in the illustration of FIG. 1, includes but is not limited to an excimer laser. An integrated photon source, such as the one used in the illustration of FIG. 3, includes but is not limited to a solid-state semiconductor laser.

As used herein, the term 1×N-port wavelength demultiplexer means a photon device with one input port and a plurality N of output ports, wherein the photon signal entering the input port may have a spectrum containing a plurality of wavelength channels; where the wavelength channel spectrum may be divided into N subsets of wavelength channels; and where the device routes each subset of wavelength channels exclusively to one output port. Therefore the device splits a number of wavelength channels among the output ports in a predetermined manner.

As used herein, the term photon-sensitive means a material that experiences a transformation when exposed by photons in an arbitrary but given range of wavelengths. Photon-sensitive films include but are not limited to photoresists.

As used herein, a beam separator is a device configured to split a single photon beam into a plurality of photon beams. Examples of beam separators are a power splitter, a wavelength demultiplexer, and a multi-wavelength vertical coupler.

Exemplary Embodiments

Figure 2:
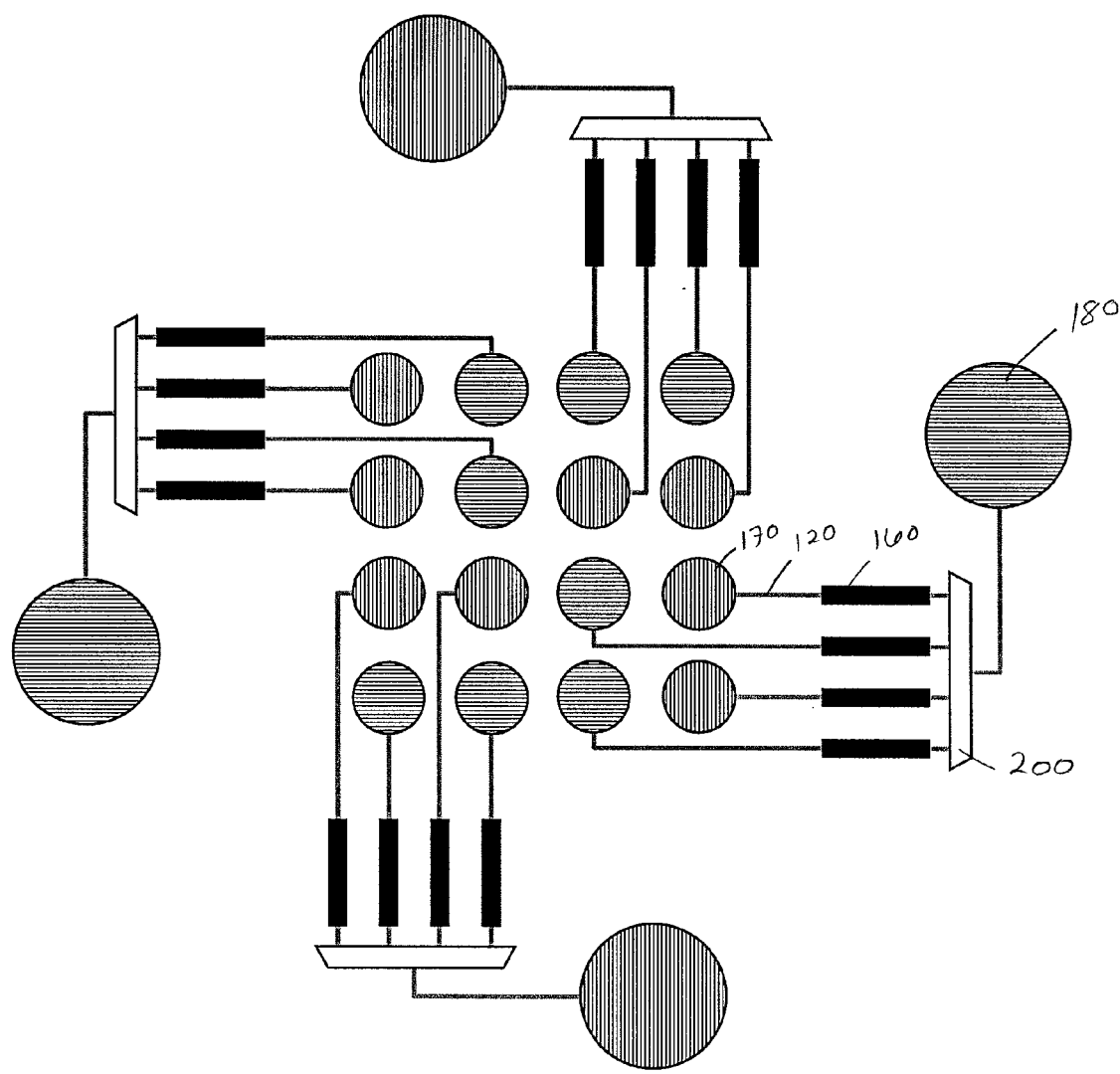
FIG. 2 is a schematic top view illustrating an embodiment of the invention with sixteen photon beams exposing the wafer.
Figure 2:
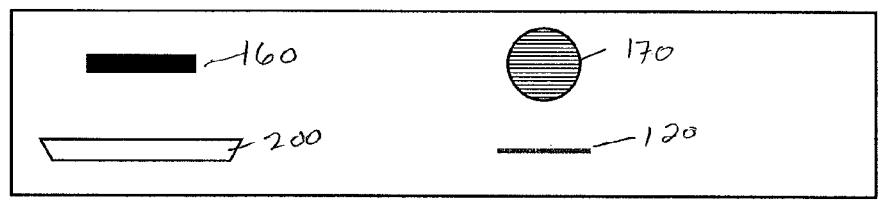
Figure 3:
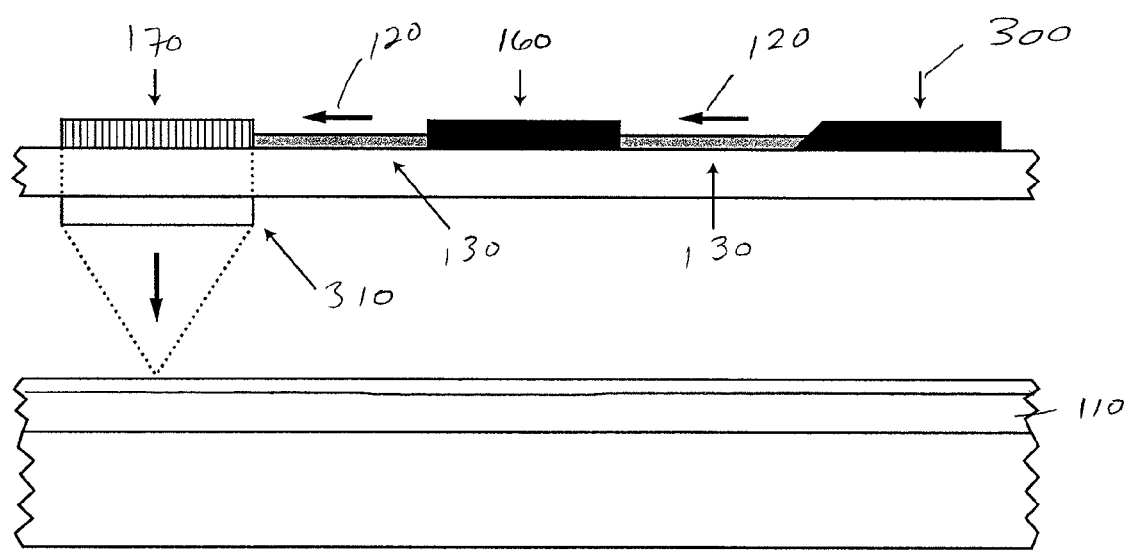
FIG. 3 is a schematic side view illustrating an embodiment of the invention employing an integrated photon source.
Figure 4:
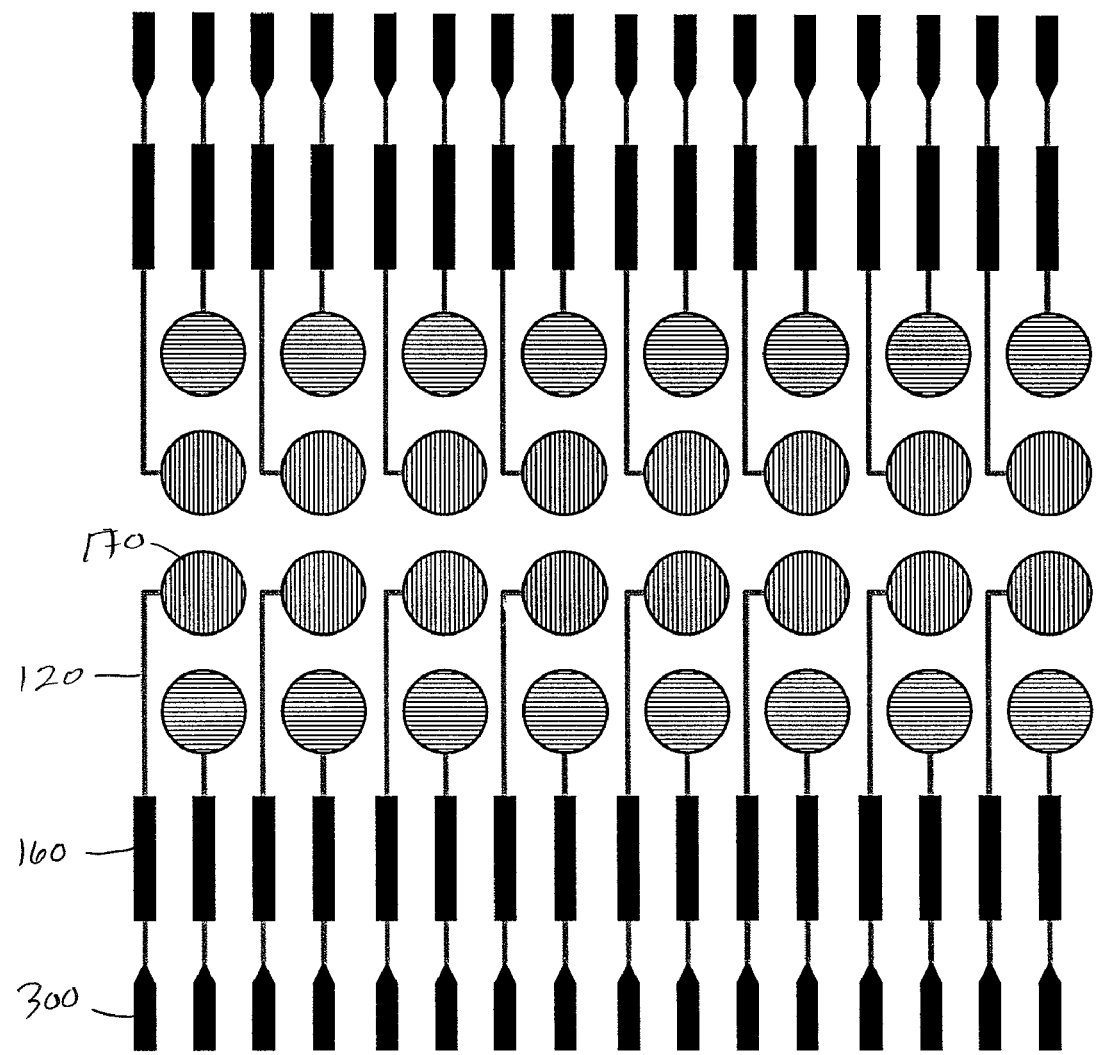
FIG. 4 is a schematic top view illustrating an embodiment of the invention with 32 photon beams exposing a wafer.

An embodiment of the invention employing one or a plurality of external photon sources is illustrated in FIG. 1 and FIG. 2; an embodiment of the invention employing integrated photon sources is illustrated in FIG. 3 and FIG. 4.

Referring to FIG. 1, in an embodiment, a maskless lithography system 100 is arranged for exposing a pattern on a wafer 110, e.g., a semiconductor wafer, such as a silicon wafer, including a photon-sensitive film 115, e.g., a photoresist layer, disposed thereover. The maskless lithography system 100 includes an external photon source (not shown) configured to generate a photon beam 120. The external photon source may be but is not limited to, for example, an excimer laser such as a KrF or a ArF excimer laser or a semiconductor laser such as a GaN laser diode. The photon beam may have a wavelength selected from a range of about 150 nanometers to about 1000 nanometers.

The maskless lithography system 100 also includes a waveguide 130 defined on a substrate 140, e.g., a transparent substrate such as a quartz, a calcium fluoride or an alumina substrate. The waveguide 130 may be, e.g., a rib waveguide, a ridge waveguide, a strip waveguide, a wire waveguide, or a rectangular waveguide formed on the substrate 140 in accordance with methods know to those of skill in the art. The waveguide 130 is configured to propagate the photon beam 120 in a plane parallel to a top surface 150 of the wafer 110. The wafer 110 is disposed under and in proximity to the substrate 140, at a distance of, e.g., 1 micrometer to 1 millimeter. The maskless lithography system includes a stage 155 on which the wafer 110 rests.

An in-plane modulator 160 modulates the photon beam 120. The in-plane modulator 120 is a structure that can rapidly change the intensity of the photon beam 120. In use, the in-plane modulator 160 modulates the photon beam 120 from the waveguide 130 that is in a plane parallel to the plane of the modulator. In-plane modulator 160 includes but is not limited to a modulator that works by inducing a phase change in one arm of an in-plane interferometer. A phase change can be induced by, but not limited to, the electro-optic effect, the thermo-optic effect, or electronic-carrier injection. In use, when a lithographic pattern is exposed on the wafer 110, the stage 155 is scanned during the lithographic exposure while the photon beams are modulated by the in-plane modulators.

The in-plane modulator 160 modulates the photon beam 120 in accordance with pattern data provided by an external controller. The maskless lithography system 100 may include a plurality of in-plane modulators 160. Data corresponding to the exposure dose to be delivered by a photon beam on a given position on the wafer determines how a modulator modulate a photon beam over the wafer. The modulation is synchronized with the movement of the wafer 110 relative to the substrate. This can be accomplished, for instance, by fixing the substrate in a stationary position and scanning the stage 155 on which the wafer 110 resides. The stage can be, for example, a heterodyne interferometric stage. A plurality of in-plane modulators 160 allows a plurality of photon beams to be independently modulated which, in turn, allows a plurality of pixels to be exposed simultaneously.

The maskless lithography system 100 also includes an output vertical coupler 170 configured to redirect the photon beam from an in-plane direction to an out-of-plane direction towards the top surface 150 of the wafer 110. The output vertical coupler 170 couples a photon beam from the waveguide 130 to free space while changing the direction of the photon beam significantly. A free-space photon beam emerging from a vertical coupler can be focused or not focused by the output vertical coupler 170, depending on the design of the vertical coupler. Output vertical coupler 170 may be, for example, based on single or multiple gratings.

Referring to FIG. 2, the maskless lithography system 100 may be configured such that sixteen photon beams expose the wafer 110.

In use, as shown in FIG. 1 and FIG. 2, a photon beam from the external photon source is coupled with an input vertical coupler 180 to the waveguide 130. The input vertical coupler is a structure that can couple a photon beam from free space to a waveguide while changing the direction of the photon beam significantly. Hence, the directions of propagation of the beam in free space and in the waveguide differ by a significant angle. Input vertical couplers may be, for example, based on single or multiple gratings.

The photon beam in the waveguide 130 is split into a plurality of photon beams. The bold arrows show the direction of the photon beam. Then, each photon beam 120 is modulated with a respective in-plane modulator 160 and redirected and focused on the wafer 110 to be exposed with an output vertical coupler. An arbitrary number of photon beams may be used. One or a plurality of external photon sources may be used and coupled to one or a plurality of waveguides with one or a plurality of input vertical couplers.

In the illustrated embodiment, one or a plurality of external photon sources create four photon beams that are coupled to the system with four vertical couplers. Each photon beam is then split in four, resulting in sixteen photon beams in total. Each of the sixteen photon beams is independently modulated and focused on the surface of the wafer to be exposed. In an embodiment, a number of photon beams in excess of 1000 may be employed.

Referring to FIG. 3 and FIG. 4, in another embodiment of the invention, photon beams originate from an integrated photon source 300, i.e., the photon source is a semiconductor laser defined on the substrate 140 or bonded to the substrate 140. Then, a photon beam is modulated with an in-plane modulator, redirected with an output vertical coupler toward the wafer 110 to be exposed, and focused on the wafer. An arbitrary number of photon beams may be used, with each photon beam being modulated with a respective in-plane modulator. One or a plurality of integrated photon sources 300 may be used. A photon beam from an integrated photon source may or may not be split into a plurality of photon beams, e.g., output photon beams. A photon source (external or integrated) may be configured to generate a plurality of photon beams.

In FIG. 2, beam separators 200 or splitters are configured to split a photon beam into several beams. A beam separator 200 may be, e.g., a power splitter, a wavelength demultiplexer, or a multi-wavelength vertical coupler. Beam separators are not illustrated in FIG. 4. Regardless of the photon source used (integrated or external), a photon beam coming from a photon source may or may not be split into a plurality of photon beams. In some embodiments, it is preferable to create an array of small input vertical couplers in place of each of the large vertical couplers shown in FIGS. 2, 5, and 7. An input vertical coupler of smaller spatial extent may allow for a broader range of wavelengths and angles of the input beam to be coupled to a waveguide. In such embodiments, beam separators may or may not be preferable.

FIG. 1 shows an output vertical coupler performing the redirection of the photon beam and the focusing of the beam. Referring to FIG. 3, in the illustrated embodiment, the redirection and the focusing of the photon beam are accomplished with two distinct structures. An output vertical coupler performs the redirection of the photon beam only, while the focusing on the wafer is performed by a focusing element 310. A focusing element is an element that can focus out-of-plane light. In an embodiment, the focusing element 310 is configured to focus a photon beam propagating in the out-of-plane direction onto the top surface of the wafer 110. Focusing element 310 may be, for example, a zone plate or a micro-lens. In an embodiment, a single integrated optical device 320 includes the output vertical coupler 170 and the focusing element 310.

The bold arrows show the direction of the photon beam. Regardless of the photon source used, embodiments of the invention may employ either an output vertical coupler redirecting and focusing the photon beam or an output vertical coupler redirecting the photon beam without focusing it on the wafer.

In FIG. 1, the waveguides and the modulators are placed on the side of the substrate facing the wafer while in FIG. 3, the waveguides and the modulators are placed on the side of the substrate 140 not facing the wafer 110. Regardless of the photon source used, the waveguides and the modulators may be placed either on the side of the substrate facing the wafer, or on the side of the substrate not facing the wafer, or on both sides of the substrate.

Referring to FIG. 4, in an embodiment of the invention, thirty-two photon beams are used to expose the wafer. Thirty-two integrated photon sources 300 create thirty-two photon beams that are independently modulated and focused on the surface of the wafer to be exposed. Other embodiments may employ more than 1000 photon beams. The illustrated embodiment employs one photon source per photon beam. Other embodiments may use multiple photon sources per photon beam or split the output of a photon source into multiple photon beams.

Figure 5A:
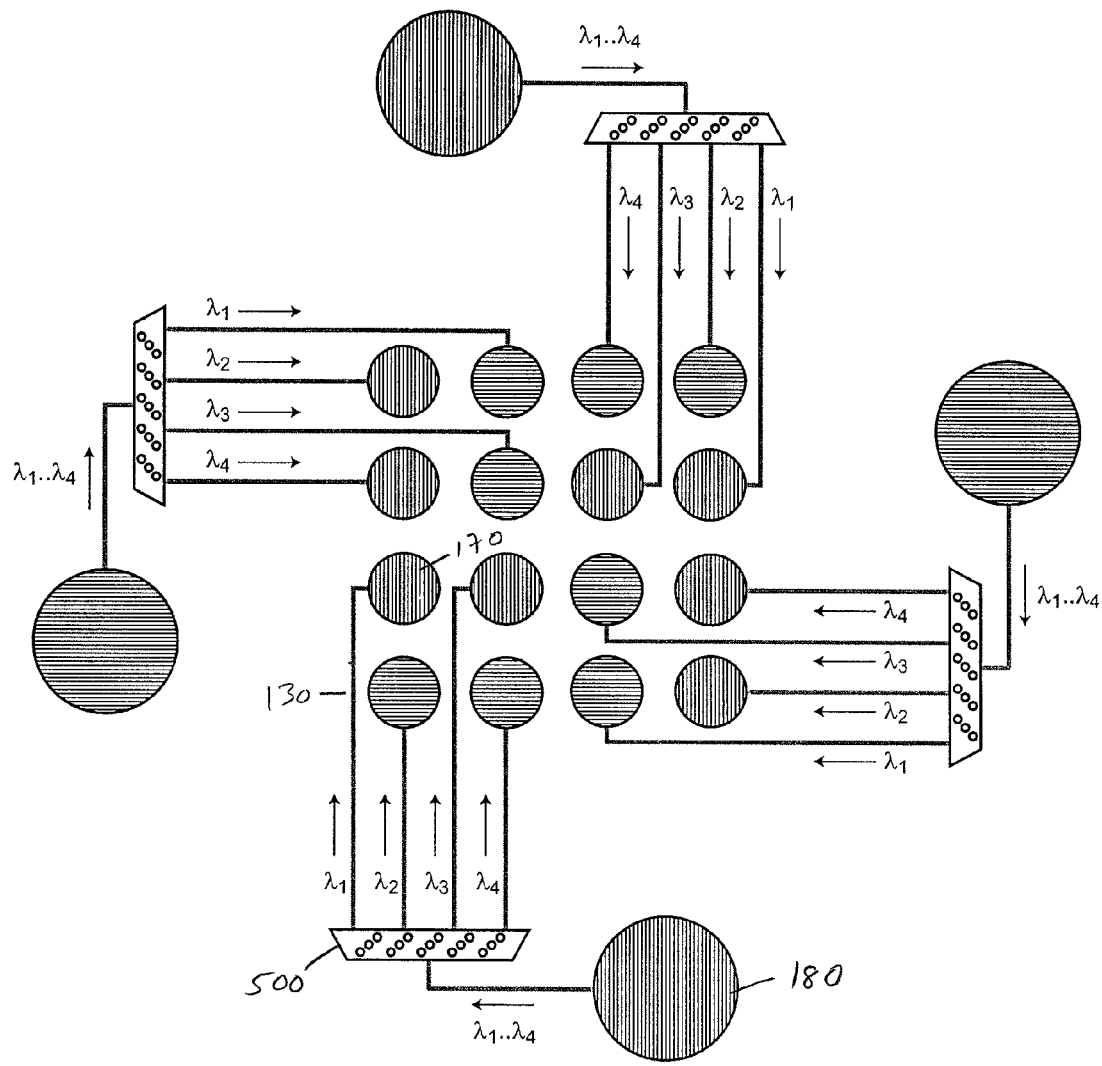
FIG. 5A is a schematic top view illustrating an embodiment of the invention with sixteen photon beams exposing the wafer using a WDM scheme.
Figure 5A:
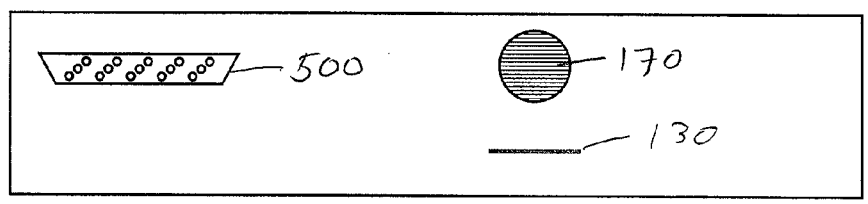
Figure 5B:
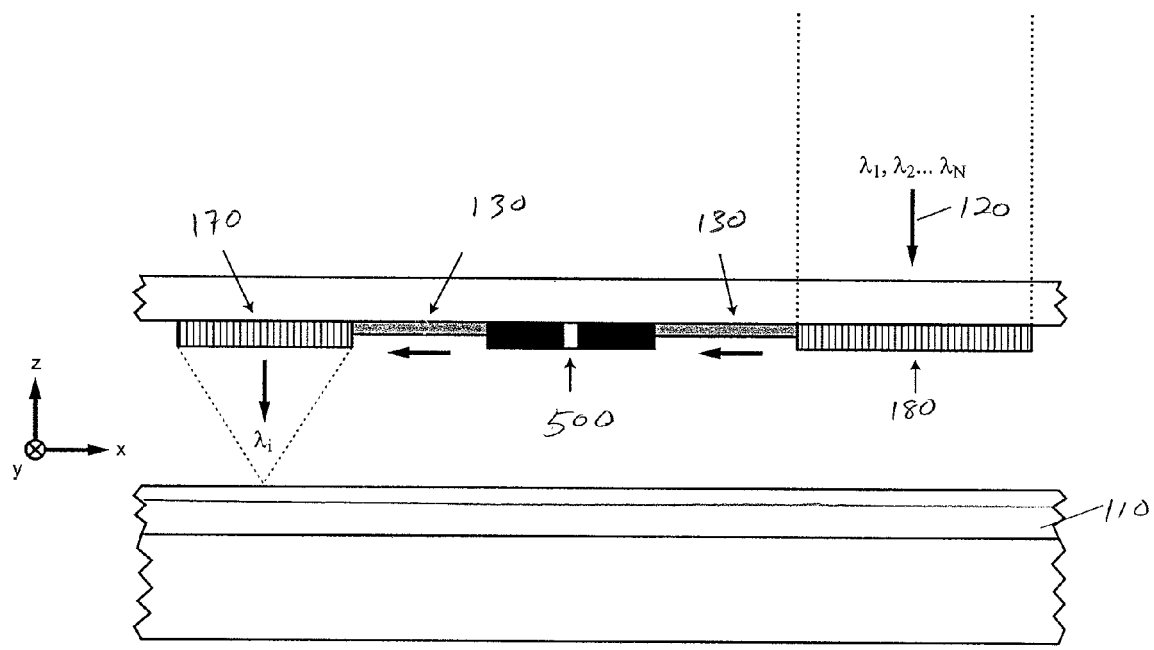
FIG. 5B is a schematic side view illustrating an embodiment of the invention employing an externally modulated WDM signal.

Referring to FIGS. 5A and 5B, in another embodiment of the invention, a modulated WDM signal is used to spatially collocate a plurality of wavelength channels into the photon beam that reaches the input vertical coupler. The plurality of wavelength channels is then spatially separated with a wavelength demultiplexer in a plane parallel to a top surface of the wafer. Each wavelength channel is then routed to a different output vertical coupler 170 that redirects the writing photons in the wavelength channel towards the wafer. Thus, the photon beam may include a plurality of wavelength channels.

In an embodiment, the photon source as well as the modulator are not integrated with the output vertical couplers 170 exposing the wafer, i.e., the photon source and the modulator are external devices. Sixteen photon beams may be used to expose the wafer using a WDM scheme. Entering each of four input vertical couplers 180 is a photon beam that includes four WDM wavelength channels generated and independently modulated by one or a plurality of external photon sources and modulators. After the input vertical coupler 180, a wavelength demultiplexer 500 spatially splits the four wavelength channels, sending one to each of four output vertical couplers 170 to expose the wafer. The result is a total of sixteen photon beams exposing the wafer. Other embodiments employing a WDM scheme may use in excess of 1000 photon beams.

As shown in FIG. 5B, an externally modulated and WDM-encoded photon beam 120 is coupled to a waveguide 130 with an input vertical coupler 180 and routed toward a wavelength demultiplexer 500. The wavelength demultiplexer spatially separates the various wavelength channels in a plane parallel to a top surface of the wafer. One of the wavelength channels ($\lambda_i$ chosen from a range of $\lambda_1$ to $\lambda_N$) is sent to the illustrated output vertical coupler, which redirects the photon beam towards a top surface of the wafer.

The wavelength demultiplexer 500 may be disposed in a plane parallel to the top surface of the wafer and configured to demultiplex the photon beam. As discussed above, the maskless lithography system may include a plurality of waveguides configured to guide the demultiplexed photon beams from the wavelength demultiplexer 500.

The output vertical couplers 170 exposing the wafer may not be identical. All vertical couplers may be trimmed to direct the input beams at substantially similar angles despite differing wavelengths entering each coupler. In the case of grating couplers, this may be accomplished by varying the grating period in accordance with the incident wavelength. The invention may employ more than 1000 of photon beams.

In use, four WDM modulated signals, at center wavelengths $\lambda_1$ to $\lambda_4$ enter the chip via an input vertical coupler. In general, any number of wavelengths may be used where the modulation rate determines the bandwidth of each channel, and thus the minimum spacing of wavelength channels, and the total available photon spectral bandwidth determines the maximum number of channels. A wavelength demultiplexer separates the four modulated wavelengths into four separate photon beams, each leading to a vertical coupler. If the total wavelength spectrum bandwidth employed for the WDM modulated signals is a sufficiently small fraction of the center wavelength, identical output vertical couplers may be employed. Otherwise, the output vertical couplers may be made non-identical, such that each output vertical coupler produces a consistent angular redirection of the guided input beam, taking into account the variation of input wavelengths incident on the different couplers.

Figure 6:
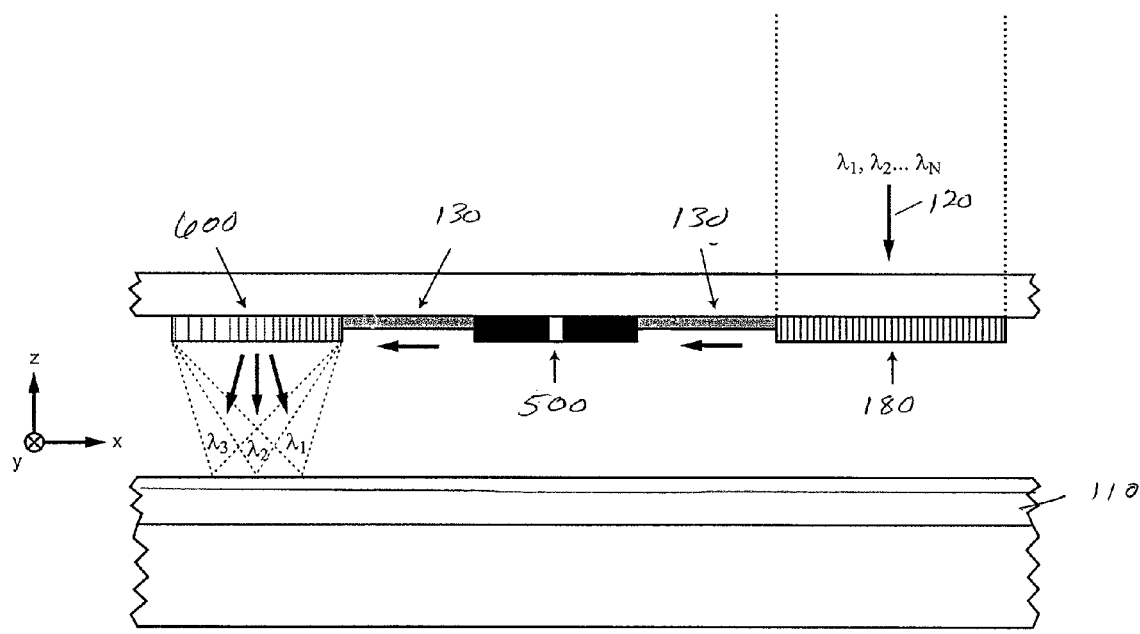
FIG. 6 is a schematic side view illustrating an embodiment of the invention employing an external multiple-wavelength-channel, modulated photon source.
Figure 7:
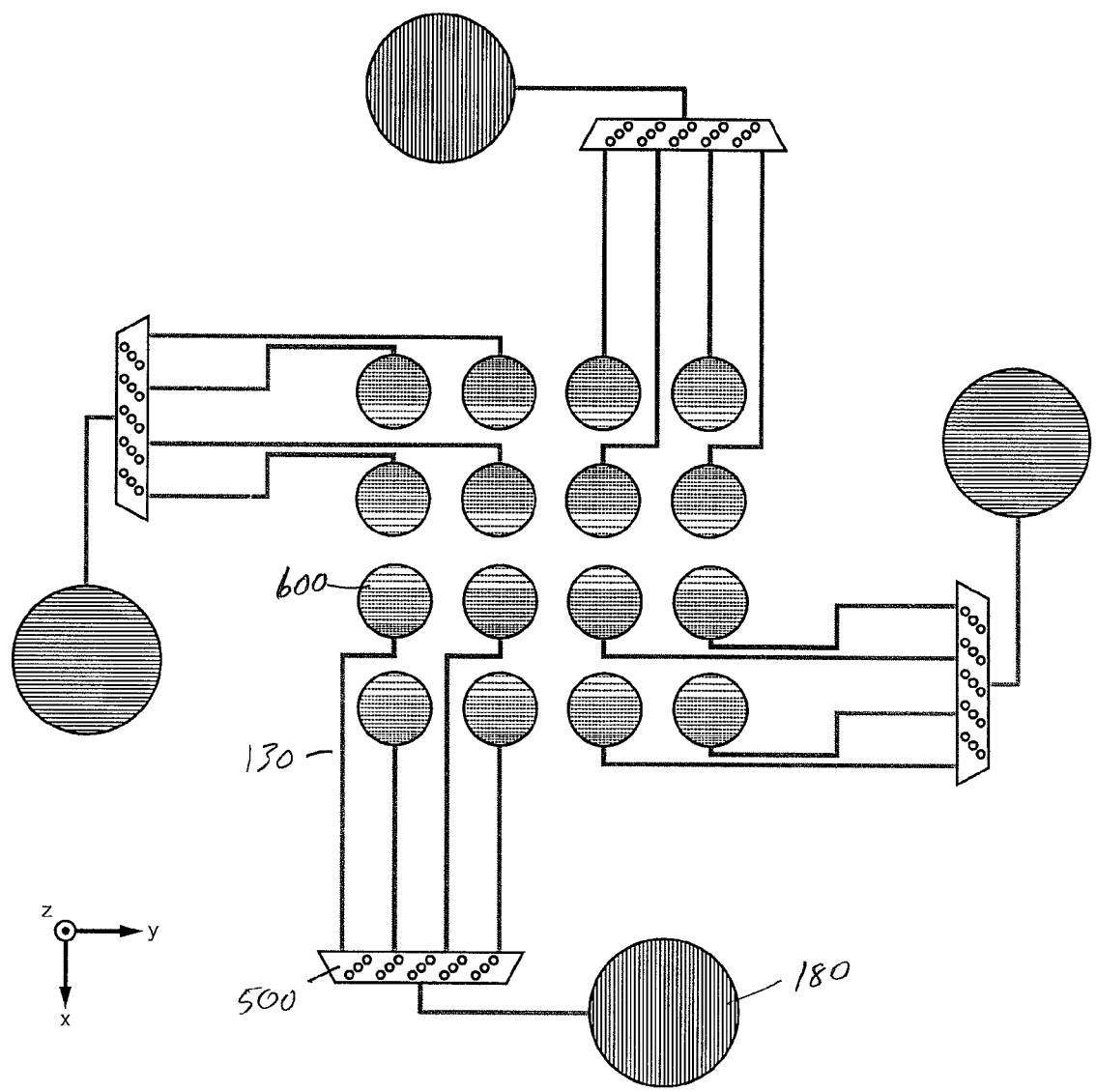
FIG. 7 is a schematic top view illustrating an embodiment of the invention with sixteen MVC.

Referring to FIG. 6 and FIG. 7, in another embodiment of the invention, each output vertical coupler that redirects and focuses the photon beam on the surface of the wafer to be exposed is an MVC 600. Each photon beam reaching an MVC includes a plurality of wavelength channels that may be independently modulated. The MVC 600 may be configured to redirect the photon beam from an in-plane direction to an out-of-plane direction. Moreover, the MVC may be designed to focus each wavelength channel to a different location on the surface of the wafer, for example by deflecting the different wavelengths to different output angles. For example, the MVC 600 may be configured to redirect a plurality of wavelength channels constituting the photon beam from an in-plane direction to a plurality of out-of-plane directions that are substantially different for at least two wavelength channels. The MVC may be configured to focus at least two of the wavelength channels on substantially different positions on the top surface of the wafer. In this manner, each MVC may simultaneously expose more than one pixel. The number of pixels simultaneously exposed may be as large as the number of wavelength channels in the photon beam reaching the MVC.

FIG. 6 illustrates the operation of an MVC as part of a system in which the photon source as well as the modulation is not integrated with the output vertical couplers exposing the wafer. Here, an external multiple-wavelength photon source is used and each wavelength of the photon source is independently and externally modulated. The bold arrows show the direction of the photon beams of different wavelengths. In the illustrated implementation, a wavelength demultiplexer selects a subset of three of the N modulated input wavelengths to be routed to each vertical coupler, with the illustrated vertical coupler receiving three wavelength channels. The vertical coupler is designed so that each wavelength channel is focused on a different point on the wafer surface, allowing for exposure of multiple pixels with one vertical coupler.

In FIG. 6, the photon source coupled via an input vertical coupler may be (but is not limited to) a free-space beam, an optical fiber, or direct coupling to another microphotonic circuit. The photon source in this example provides several intensity-modulated beams at different wavelengths, illustrated in FIG. 6 as $\lambda_1$ to $\lambda_N$. An integrated wavelength demultiplexer selects a sub-band of wavelengths, in this case $\lambda_1$ to $\lambda_3$ to be routed to the MVC shown in FIG. 6. The remaining wavelength sub-bands may be routed to other MVCs, as illustrated in FIG. 7.

Referring to FIG. 7, in an embodiment, sixteen MVCs may be used. In the given example, each MVC 600 receives three modulated wavelength channels. One or a plurality of external photon sources create four photon beams, each including twelve independently modulated wavelength channels. Each of the four photon beams is coupled to the system with a vertical coupler 180. Each modulated, multi-wavelength photon beam is then spectrally divided by the integrated wavelength demultiplexer 500 into four sub-bands, such that each waveguide 130 carries three of the incoming modulated wavelength channels. Each of the three wavelength channels reaching a given MVC 600 is focused on a different position at the wafer surface. The result is exposure of 48 independent pixels (16 times 3) at a time. To expose a pattern in a wafer, the wafer is moved with respect to the substrate or the substrate is moved with respect to the wafer, with 48 independent pixels being exposed each time. To substantially reproduce a predetermined pattern, the external modulation of the multi-wavelength photon beams is synchronized with the displacement of the wafer with respect to the substrate, or equivalently, with the displacement of the substrate with respect to the wafer. More than 1000 photon beams may be employed in a similar configuration.

A comparison of FIG. 5A and FIG. 7 shows that the wavelength-division multiplexing of input photon beams may be used either to provide a single writing beam to each of a number of spatially separated output vertical couplers (FIG. 5A) from one photon beam, to provide multiple writing beams in each MVC, or to provide multiple writing beams in each spatially separated MVC from one photon beam (FIG. 7). The photon source and the modulators may or may not be integrated with the MVCs.

It will be appreciated by one of skill in the art that the attached figures are explanatory schematics and are not illustrations of exact implementations of all embodiments the invention. Some implementations may employ a very large number of output vertical couplers and in-plane modulators, e.g., possibly in excess of 1000 couplers and in excess of 1000 modulators. Such systems are challenging to precisely illustrate schematically. Hence, simplified systems with relatively low number of beams are presented herein for explanatory purposes.

The registering of the exposed pattern on the wafer may be done as known to one of skill in the art. A thin photon-sensitive film, having a thickness of, e.g., 0.1 nanometer to 1 millimeter, is formed over the top surface of the wafer and experiences a transformation when exposed by the focused photon beam. This transformation may be used to develop the exposed pattern on the wafer. The photon-sensitive material may be a photoresist. Any suitable photoresist may be used with embodiments of the present invention.

What is claimed is:

1. A maskless lithography system for exposing a pattern on a wafer having a photon-sensitive film disposed thereover, the system comprising:

a photon source for generating a photon beam having a wavelength selected from a range of about 150 nanometers to about 1000 nanometers;

a waveguide, disposed on a substrate, for propagating the photon beam in a plane parallel to a top surface of the wafer, a distance between the substrate and the top surface of the wafer being at least 1 μm;

an in-plane modulator for modulating the photon beam; and an output vertical coupler for redirecting the photon beam from an in-plane direction to an out-of-plane direction towards the top surface of the wafer, wherein (i) the waveguide comprises at least one of a rib waveguide, a strip waveguide, a wire waveguide, or a rectangular waveguide, (ii) the in-plane modulator modulates the photon beam propagated by the waveguide in the plane parallel to the top surface of the wafer, and (iii) the output vertical coupler comprises a grating.

2. The maskless lithography system of claim 1, further comprising:

a focusing element for focusing the photon beam propagating in the out-of-plane direction onto the top surface of the wafer.

3. The maskless lithography system of claim 2, wherein the output vertical coupler and the focusing element form a single integrated optical device.

4. The maskless lithography system of claim 1, further comprising:

an input vertical coupler, wherein the photon source comprises an external photon source and the input vertical coupler couples the external photon source to the waveguide.

5. The maskless lithography system of claim 1 wherein the photon beam comprises a plurality of wavelength channels.

6. The maskless lithography system of claim 5, further comprising:

a wavelength demultiplexer, disposed in a plane parallel to the top surface of the wafer, for demultiplexing the photon beam into beamlets, wherein the system comprises a plurality of the waveguides for guiding the demultiplexed photon beamlets from the wavelength demultiplexer.

7. The maskless lithography system of claim 5, further comprising:

a multi-wavelength vertical coupler for redirecting the photon beam from the in-plane direction to the out-of-plane direction.

8. The maskless lithography system of claim 7 wherein the multi-wavelength vertical coupler for redirecting the plurality of wavelength channels constituting the photon beam from the in-plane direction to a plurality of the out-of-plane directions that are substantially different for at least two wavelength channels selected from the plurality of wavelength channels.

9. The maskless lithography system of claim 7 wherein the multi-wavelength vertical coupler is configured for focusing at least two of the wavelength channels on substantially different positions on the top surface of the wafer.

10. The maskless lithography system of claim 1, wherein the photon source generates a plurality of the photon beams.

11. The maskless lithography system of claim 10, wherein the waveguide comprises a plurality of waveguides, disposed on the substrate, for propagating the photon beams in the plane parallel to the top surface of the wafer.

12. The maskless lithography system of claim 1, further comprising a beam separator for further splitting the photon beam into a plurality of output photon beamlets.

13. The maskless lithography system of claim 12, wherein the beam separator is selected from the group consisting of a power splitter, a demultiplexer, a multi-wavelength vertical coupler, and combinations thereof.

14. The maskless lithography system of claim 12, wherein the waveguide comprises a plurality of waveguides, disposed on the substrate, for propagating the output photon beamlets in the plane parallel to the top surface of the wafer.

15. The maskless lithography system of claim 1, further comprising:
a stage for holding the wafer.

16. The maskless lithography system of claim 1, wherein the in-plane modulator comprises an in-plane interferometer.

17. The maskless lithography system of claim 1, wherein the in-plane modulator modulates the photon beam at a modulation speed of at least 1 GHz.

18. The maskless lithography system of claim 1, wherein the photon source comprises a plurality of photon sources generating a plurality of the photon beams, and the waveguide comprises a plurality of waveguides disposed on the substrate for propagating the plurality of photon beams originating from the photon sources in the plane parallel to the top surface of the wafer.

19. The maskless lithography system of claim 1, wherein the photon beam has a wavelength selected from a range of about 193 nanometers to about 400 nanometers.

20. The maskless lithography system of claim 1, wherein the photon source is selected from the group consisting of an excimer laser and a semiconductor laser.

21. The maskless lithography system of claim 20, wherein the photon source is selected from the group consisting of a KrF excimer laser, an ArF excimer laser, and a GaN laser diode.

22. The maskless lithography system of claim 1, wherein the photon source generates a plurality of photon beams, and the system further comprises at least 1000 vertical couplers, at least 1000 in-plane modulators and at least 1000 waveguides disposed on the substrate for propagating the plurality of photon beams originating from the photon source in the plane parallel to the top surface of the wafer.

23. The maskless lithography system of claim 22, wherein the photon source comprises a plurality of photon sources for generating the plurality of photon beams.

* * * * *